United States Patent
Sakamoto

(10) Patent No.: US 7,699,622 B2
(45) Date of Patent: Apr. 20, 2010

(54) ELECTRONIC UNIT AND ASSEMBLING METHOD THEREOF

(75) Inventor: Nobuyuki Sakamoto, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/979,186

(22) Filed: Oct. 31, 2007

(65) Prior Publication Data
US 2008/0113530 A1    May 15, 2008

(30) Foreign Application Priority Data
Nov. 10, 2006 (JP) .............................. 2006-305422

(51) Int. Cl.
*H01R 12/00*    (2006.01)
(52) U.S. Cl. ................................... 439/76.1
(58) Field of Classification Search ................ 439/76.1, 439/352
See application file for complete search history.

(56) References Cited

U.S. PATENT DOCUMENTS

| | | | | |
|---|---|---|---|---|
| 5,103,375 | A * | 4/1992 | Cottingham et al. | 361/715 |
| 5,382,169 | A * | 1/1995 | Bailey et al. | 439/76.2 |
| 5,554,037 | A * | 9/1996 | Uleski | 439/76.1 |
| 5,774,342 | A * | 6/1998 | Brandenburg et al. | 361/774 |
| 5,814,765 | A * | 9/1998 | Bauer et al. | 174/50.54 |
| 6,368,119 | B2 * | 4/2002 | Murakami | 439/76.2 |
| 6,375,477 | B2 * | 4/2002 | Nishikawa et al. | 439/76.1 |
| 6,437,986 | B1 * | 8/2002 | Koshiba | 361/752 |
| 6,493,232 | B2 * | 12/2002 | Skofljanec | 361/752 |
| 6,743,040 | B1 * | 6/2004 | Nakamura | 439/352 |
| 6,926,540 | B1 * | 8/2005 | Juntwait | 439/76.1 |
| 7,101,199 | B2 * | 9/2006 | Yamashita | 439/76.1 |
| 7,149,089 | B2 * | 12/2006 | Blasko et al. | 361/752 |
| 7,331,801 | B1 * | 2/2008 | Eichorn | 439/79 |
| 2005/0020104 | A1 * | 1/2005 | Yamamoto et al. | 439/76.1 |

FOREIGN PATENT DOCUMENTS

JP    2005-117741    4/2005

* cited by examiner

*Primary Examiner*—Tho D Ta
(74) *Attorney, Agent, or Firm*—Edwards Angell Palmer & Dodge LLP

(57) ABSTRACT

An electronic unit includes a case, a printed circuit board, a connector block, and a connector introducing portion. The case is selected from a waterproof case and a non-waterproof case. The connector block is mounted upon the printed circuit board. The connector block has a retaining projection that engages a mating connector. The connector introducing portion is integrally formed with the cases and yet separately from the connector block. The connector introducing portion of the waterproof case has a retaining projection that engages the mating connector. The electronic unit is assembled with the case selected from the waterproof case and the non-waterproof case, and with the printed circuit board and the connector blocks received in the case that has been chosen.

12 Claims, 5 Drawing Sheets

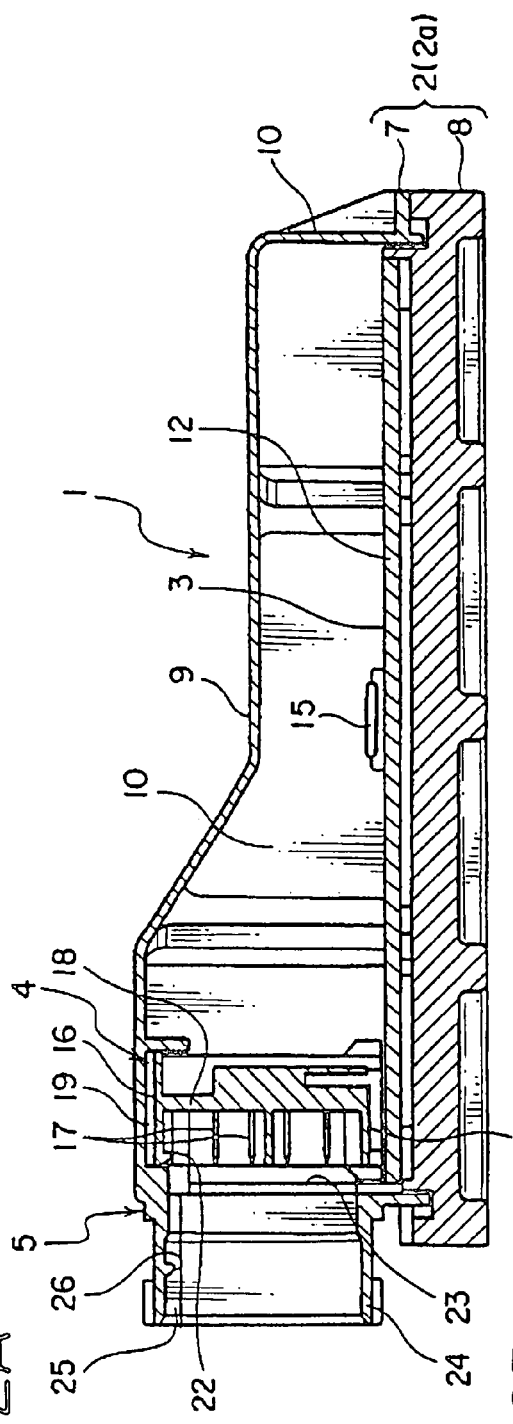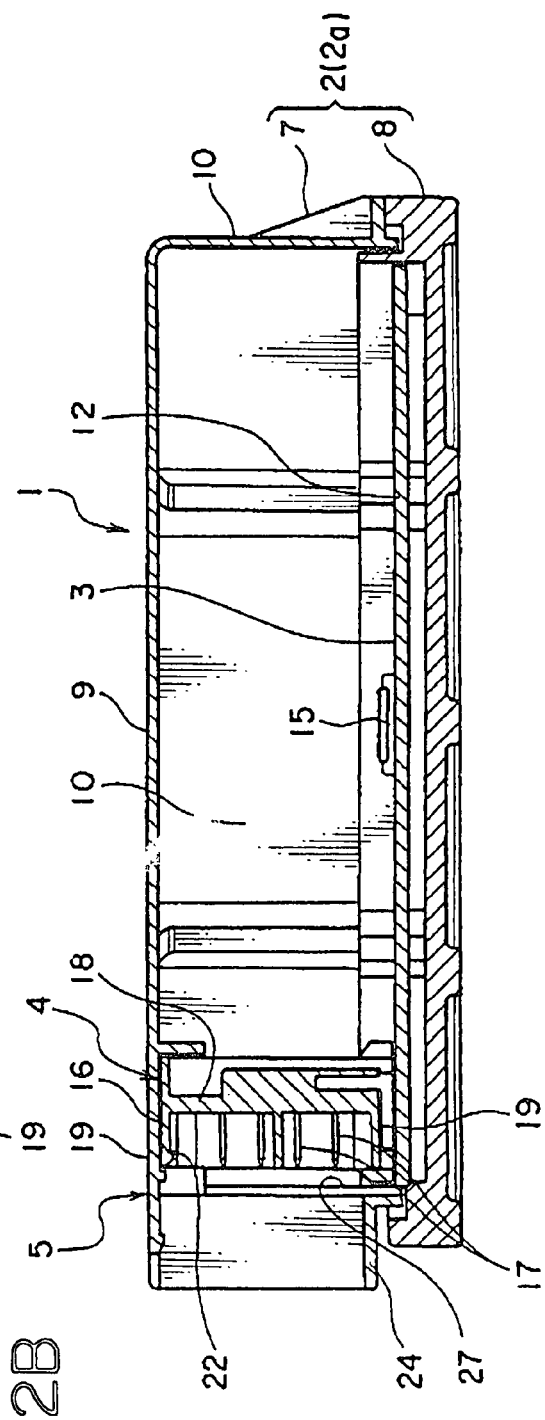

ELECTRONIC UNIT AND ASSEMBLING METHOD THEREOF

CROSS REFERENCE TO RELATED APPLICATIONS

The priority application Japan Patent Application No. 2006-305422 upon which this patent application is based is hereby incorporated by reference.

BACKGROUND OF THE INVENTION

1. Field of the Invention

The present invention relates to an electronic unit for automobiles and other vehicles and an assembling method thereof.

2. Description of the Related Art

A variety of the electronic units including an electronic control unit are widely used in motor vehicles and other movable bodies. These electronic units have a case, a printed circuit board received in the case, and a connector block provided on the printed circuit board and formed integrally with the case. See Patent Document 1 (Japanese Patent Application Laid-Open Publication No. 2005-117741).

The connector block has terminals that are connected to a conductive pattern of the printed circuit board in accordance with a predetermined pattern. The connector block engages a mating connector, i.e., a connector to be connected to the connector block. Various electronic components are mounted on the printed circuit board on a surface of which the conductive pattern made of copper foil, for example, is formed. The electronic components are electrically connected to the conductive pattern in accordance with the predetermined pattern. Also, the mating connector is connected to the connector block of the electronic unit, and a terminal of the mating connector is connected to the terminal of the electronic unit.

It is via the above terminal that the terminal of the mating connector is electrically connected to the conductive pattern, and therefore to the electronic components of the electronic unit. Also, it is via the mating connector connected to the connector block of the electronic unit that numerous wiring harnesses of the motor vehicle are electrically connected to the electronic unit.

The electronic unit disclosed in Patent Document 1 has either a waterproof case that prevents liquid and vapor from entering the case, or a non-waterproof case that allows entry of the liquid and vapor into the case. Since the electronic unit described in Patent Document 1 has the connector block formed integrally with the case, it follows that two types of the connector blocks are necessary in order to assemble the conventional electronic unit, i.e., the connector block for the waterproof case and the connector block for the non-waterproof case.

Notably, the conventional electronic unit described in Patent Document 1 includes the connector block mounted on the printed circuit board. This implies that making the conventional electronic unit presupposes two types of the printed circuit boards that respectively support the above-mentioned two types of the connector blocks. Thus, two different suites of the case, the connector block, and the printed circuit board are required for assembling the conventional electronic units depending upon whether or not the case has to have a waterproof property. The more types of the components, the more costly it will be to make the electronic unit.

SUMMARY OF THE INVENTION

Hence, an object of the present invention is to provide an electronic unit which allows commonality of components between waterproof and non-waterproof cases and a method for assembling the electronic unit.

In order to attain the above objective, the present invention is to provide the electronic unit which includes a box-shaped case, a printed circuit board received in the case and provided with electronic components, a connector block mounted on the printed circuit board and connected to a mating connector, and a connector introducing portion for guiding the mating connector to the connector block. Notably, the connector introducing portion is formed integrally with the case and yet separately from the connector block.

With the construction described above, since the connector introducing portion is formed separately from the connector blocks mounted upon the printed circuit board, the same printed circuit board and the same connector block can be used both in a waterproof case which prevents entry of liquid and vapor into the case and a non-waterproof case which allows the entry of the liquid and vapor. Accordingly, this construction improves the commonality of the components for use in the electronic unit and helps reduce production cost of the electronic unit.

Preferably, the electronic unit according to the present invention provides a waterproof or non-waterproof case. The mating connector is consequently either a waterproof connector for the waterproof case or a non-waterproof connector for the non-waterproof case. Notably, the connector block includes an engagement portion for engaging a locking portion of the mating non-waterproof connector while the waterproof case includes the connector introducing portion having an engagement portion for engaging a locking portion of the mating waterproof connector.

With the construction described above, since the connector block has the engagement portion which engages the locking portion of the mating non-waterproof connector, the non-waterproof case does not need to have the engagement portion. This configuration achieves the non-waterproof case with reduced size. In addition, since the waterproof case has the engagement portion which engages the mating waterproof connector, secure connection between the waterproof case and the mating connector can be maintained while keeping a junction of the waterproof case and the connector block impervious to the liquid and vapor. Accordingly, this configuration also achieves reliable connection between the connector block and the mating waterproof connector while maintaining sufficient waterproofness.

In order to attain the above objective, the present invention is further to provide an assembling method of an electronic unit which includes a box-shaped case, a printed circuit board provided with electronic components and received in the case, the connector block mounted on the printed circuit board and connected to a mating connector, and a connector introducing portion formed integrally with the case and yet separately from the connector block, for guiding the mating connector to the connector block. In addition, the case is selected from a waterproof case which prevents entry of liquid and vapor and a non-waterproof case which allows the entry of the liquid and vapor, and then the printed circuit board is received in the case that has been chosen.

With the construction described above, since the connector introducing portion is formed separately from the connector blocks mounted upon the printed circuit board, the same printed circuit board and the same connector block can be used both in the waterproof case and in the non-waterproof case. This construction improves the commonality of the components for use in the electronic unit and helps reduce the production cost of the electronic unit.

Preferably, the electronic unit to be assembled by the assembling method of the present invention has a waterproof or non-waterproof case. The mating connector is a waterproof connector for the waterproof case or a non-waterproof case for the non-waterproof connector. Notably, the connector block includes an engagement portion for engaging a locking portion of the mating non-waterproof connector while the connector, introducing portion includes an engagement portion for engaging a locking portion of the mating waterproof connector.

With the construction described above, since the non-waterproof case does not need to be provided with the engagement portion, the non-waterproof case can be made smaller. In addition, since the waterproof case has the engagement portion which engages the mating connector, the secure connection between the printed circuit board and the mating connector is maintained while the junction of the waterproof case and the connector block is kept impervious to the liquid and vapor. This configuration achieves reliable connection between the connector block and the mating connector while maintaining sufficient waterproofness.

BRIEF DESCRIPTION OF THE DRAWINGS

These and other objects, features, and advantages of the present invention will become more apparent upon reading of the following detailed description along with the accompanied drawings, in which:

FIG. 2A is a cross-sectional view of the electronic unit of FIG. 1A.

FIG. 2B is a cross-sectional view of the electronic unit of FIG. 1B.

DESCRIPTION OF THE PREFERRED EMBODIMENT

An embodiment of an electronic unit of the present invention is described with reference to the attached FIGS. 1 to 5.

Figure 1A:
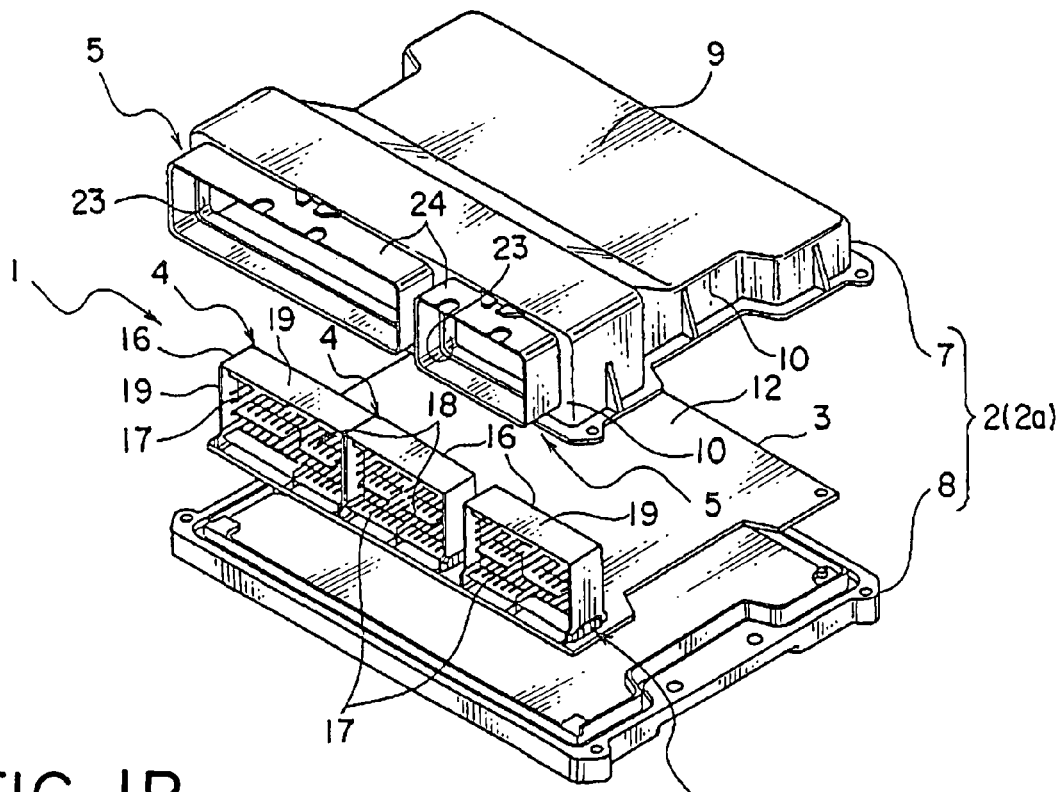
FIG. 1A is an exploded perspective view of an electronic unit that includes a waterproof case according to a preferred embodiment of the present invention.
Figure 1B:
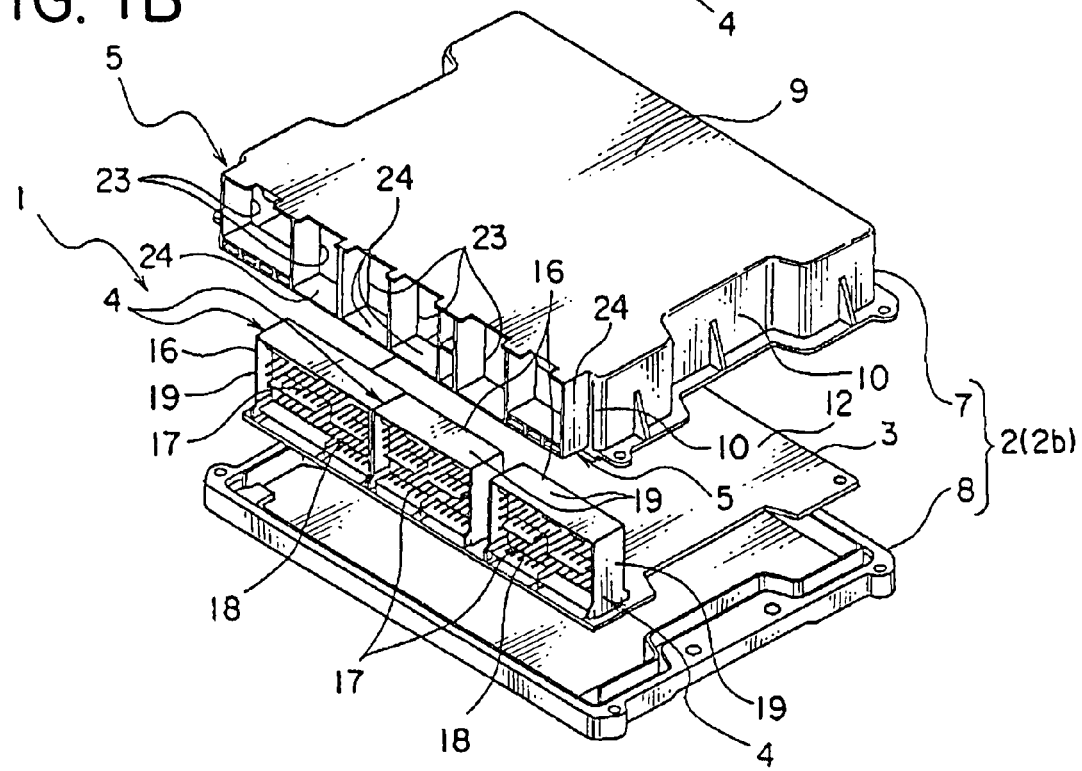
FIG. 1B is an exploded perspective view of an electronic unit that includes a non-waterproof case according to the preferred embodiment of the present invention.

Referring to FIGS. 1A and 1B, the electronic unit 1 is mounted as a non-limiting example in a motor vehicle. The electronic unit 1 includes a box-shaped case 2, a printed circuit board 3 received in the case 2, a plurality of connector blocks 4, and a connector introducing portion (see also FIGS. 1 to 3).

The case 2 is a flat box-shaped case which includes two members, i.e., a first case member 7 and a second case member 8 which can be attached to and detached from each other.

The first case member 7 has a flat ceiling wall 9 and a plurality of peripheral walls 10 formed continuously with an outer edge of the ceiling wall 9. The flat ceiling wall 9 is approximately rectangular. The plurality of the peripheral walls 10 rise from the outer edge of the ceiling wall 9 in a same direction with respect to each other. The peripheral walls 10 are also formed integrally with each other. In the attached drawings, the four peripheral walls 10 are illustrated.

The second case member 8 is formed to be flat and made of insulating synthetic resin. The second case member 8 engages the first case member 7 in such a manner that the second case member 8 seals openings formed on an outer periphery of the case member 7 continuous with the peripheral walls 10 of the case member 7.

The case 2 of the electronic unit 1 can be either a waterproof case 2a which prevents entry of liquid and vapor into the case 2a (see FIG. 1A) or a non-waterproof case 2b which is intended for use in a part where penetration of the liquid and vapor is not allowed (see FIG. 1B). This means that the electronic unit 1 may have either of the waterproof case 2a or the non-waterproof case 2b. In other words, there are two types of the electronic unit 1, i.e., the electronic unit having the waterproof case 2a and the electronic unit having the non-waterproof case 2b.

The waterproof case 2a has a packing (not shown) provided between the first case member 7 and the second case member 8. The packing is made of natural or synthetic rubber or other elastic synthetic materials. By virtue of this packing, a junction of the first and second case members 7 and 8 is made impervious to the liquid and vapor. In addition, the connector blocks 4 of the waterproof case 2a are held tightly in contact with the case members 7, 8 and kept waterproof.

The non-waterproof case 2b, in contrast, does not have the packing provided between the first case member 7 and the second case member 8 and a gap is left between these two case members. The non-waterproof case 2b also leaves gaps between the case members 7, 8 and the connector blocks 4. Waterproofness is not guaranteed due to these gaps.

Referring now to FIGS. 2A and 2B, the printed circuit board 3 includes a flat board 12 and a conductive pattern which is formed on a surface of the board 12. The board 12 is made of insulating synthetic resin. The conductive pattern is made of metal foil such as copper foil. Various electronic components 15 are provided on the printed circuit board 3. The electronic components 15 are electrically connected to the conductive pattern in accordance with a predetermined pattern.

The connector block 4 includes a block body 16 and a plurality of terminals 17. The block body 16, which is made of insulating synthetic resin, includes a base plate 18 and a plurality of peripheral plates 19 rising from an outer edge of the base plate 18, and is formed in a bottomed cylindrical shape. The connector block 4 is fixed to the printed circuit board 3 with one of the peripheral plates 19 placed upon the outer edge of the printed circuit board 3. Also, the plurality of the connector blocks 4 are arranged lengthwise with respect to the outer edge of the printed circuit board 3.

The terminals 17 are bar-shaped and made of conductive metal. The terminal 17, passing through the base plate 18, is mounted in the block body 16 so that one end of the terminal 17 is in the block body 16, and the other end of the terminal 17 is adjacent to the center of the printed circuit board 3. In addition, the terminals 17 are mounted in the block body 16 in such a manner that the terminals 17 are in parallel with each other. The other end of the terminal 17 is electrically connected to the conductive pattern of the printed circuit board 3.

Figure 3A:
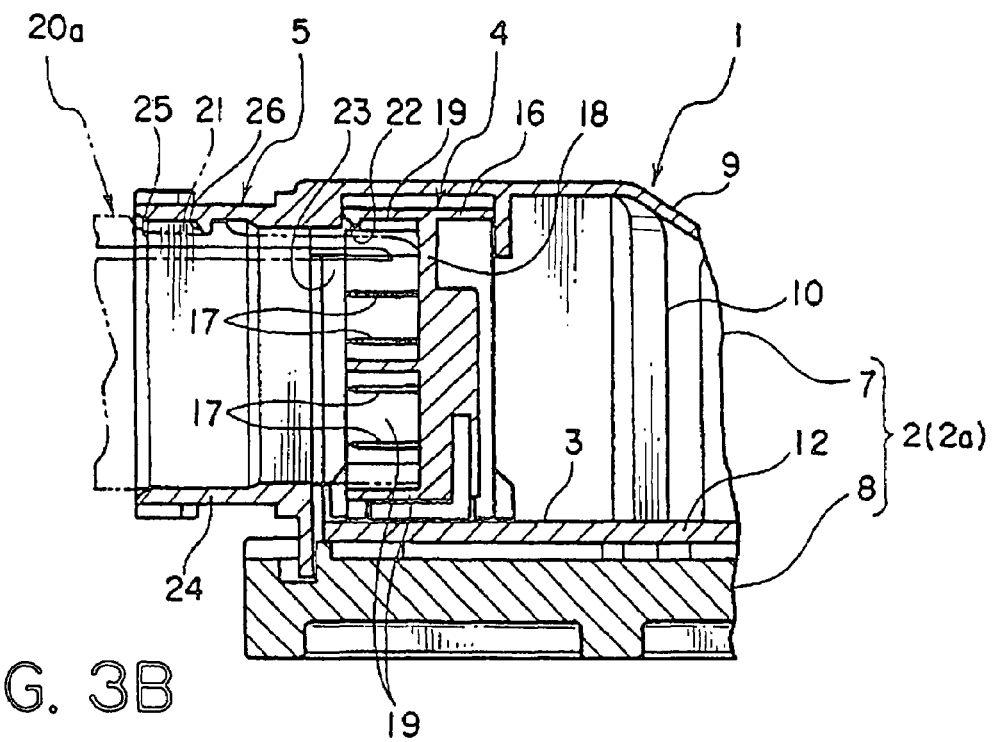
FIG. 3A is an enlarged cross-sectional view of main portions of the electronic unit of FIG. 2A.
Figure 3B:
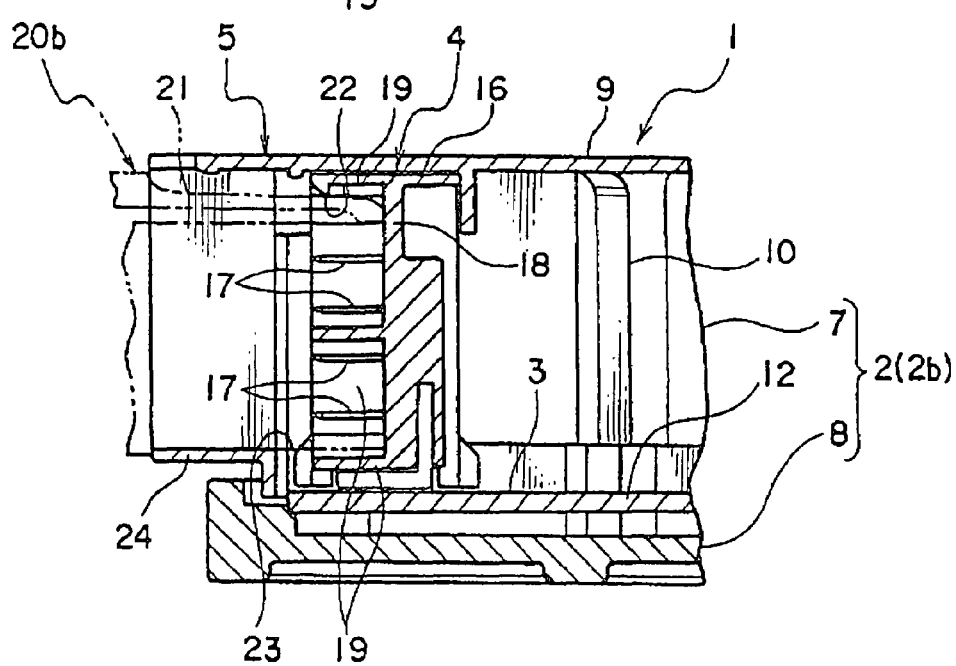
FIG. 3B is an enlarged cross-sectional view of main portions of the electronic unit of FIG. 2B.

Referring now to FIGS. 3A and 3B where the connector blocks 4 are connected to mating connectors indicated by chain double-dashed lines, i.e., a mating waterproof connector 20a and a mating non-waterproof connector 20b. The mating connector is the waterproof connector 20a when the waterproof case 2a is selected. Likewise, the mating connector has to be the non-waterproof connector 20b when the non-waterproof case 2b is to be used. The female terminal of the mating waterproof connector 20a and mating non-waterproof connector 20b is electrically connected to the conductive pattern of the printed circuit board 3. Thus, the connector block 4 electrically connects the female terminal of the mating waterproof connector 20a and mating non-waterproof connector 20b to the conductive pattern of the printed circuit board 3. Note that the mating waterproof connector 20a for the electronic unit 1 having the waterproof case 2a has an appearance different from that of the mating non-waterproof connector 20b for the electronic unit 1 with the non-waterproof case 2b.

Also, the connector block 4 has a retaining projection 22 which engages a locking arm 21 of the mating non-waterproof connector 20b. The retaining projection 22 and the locking arm 21 are an engagement portion and a locking portion of the present invention, respectively. The retaining projection 22 projects from the inner surface of the peripheral plate 19 of the block body 16.

The connector blocks 4 with the above-described configuration are mounted on the printed circuit board 3, and the connector blocks 4 and the printed circuit board 3 are received in the case 2a or 2b. The received connector blocks 4 are arranged at a position where the connector blocks 4 are exposed to the outside of the cases 2a or 2b via openings 23 (later described). Further, the printed circuit board 3 and the connector blocks 4 of the electronic unit 1 having the waterproof case 2a have the same configuration and shape as those of the printed circuit board 3 and the connector blocks 4 of the electronic unit 1 having the non-waterproof case 2b. This means that the electronic unit 1 having the waterproof case 2a and the electronic unit 1 having the non-waterproof case 2b are both capable of incorporating the same printed circuit board 3 in combination with the same connector blocks 4.

Referring again to FIGS. 1A and 1B, the connector introducing portion 5 has the openings 23 provided on one of the peripheral walls 10 of the first case member 7 and a cylindrical portion 24 in a cylindrical shape. The opening 23 has a rectangular shape and is provided through the peripheral wall 10. Note that the peripheral wall 10 having the openings 23 is on the same side as the outer edge of the printed circuit board 3 along which the connector blocks 4 are arranged in parallel with each other (see FIGS. 1A and 1B).

The cylindrical portion 24 is formed in a flat rectangular cylinder shape. The cylindrical portion 24 extends outwardly and perpendicularly from the peripheral wall 10 and accommodates the openings 23 of the peripheral wall 10. With the openings 23 and the cylindrical portion 24, the connector introducing portion 5 can be formed integrally with the cases 2a and 2b and yet separately from the connector blocks 4. The cylindrical portion 24 of the connector introducing portion 5 has a shape of a female connector housing. The inner space of the connector introducing portion 5 communicates from the inner space to the outside of the cases 2a and 2b via the above-mentioned opening 23. The mating waterproof connector 20a and mating non-waterproof connector 20b are connected through the connector introducing portion 5 which guides the mating waterproof connector 20a and mating non-waterproof connector 20b thereinside to the connector blocks 4.

Figure 4:
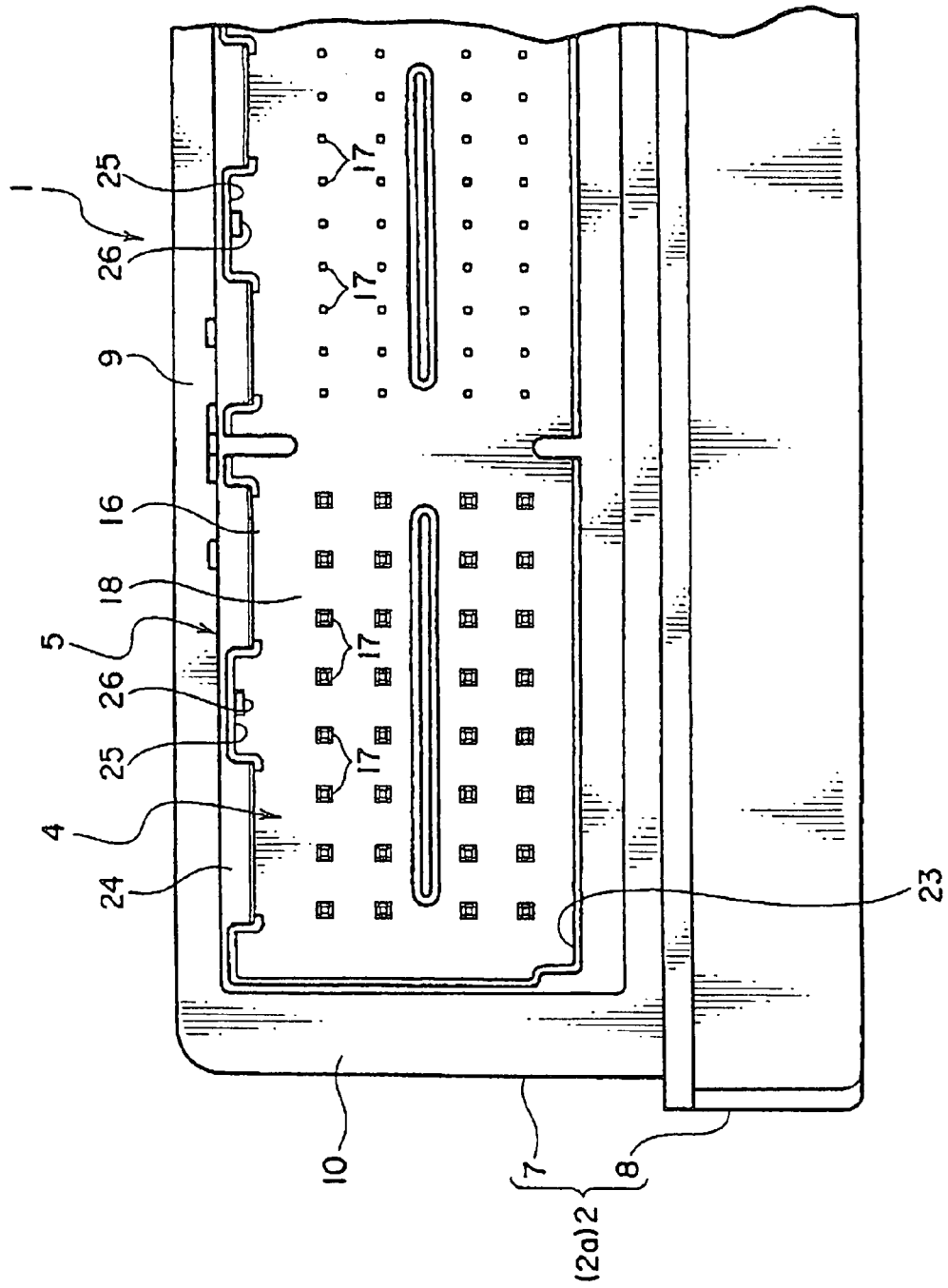
FIG. 4 is a front view of a portion of the electronic unit of FIG. 1A.

Referring now to FIG. 4, the inner surface of the cylindrical portion 24 of the connector introducing portion 5 of the waterproof case 2a has a receiving groove 25 for receiving the locking arm 21 of the mating waterproof connector 20a and mating non-waterproof connector 20b and a retaining projection 26 for engaging the locking arm 21. The receiving projection 26 is an engagement portion of the present invention. The receiving groove 25 is formed on the inner surface of the cylindrical portion 24 of the connector introducing portion 5 in a longitudinal direction with respect to the terminals 17. In other words, the receiving groove 25 linearly extends in a direction in which the mating waterproof connector 20a and mating non-waterproof connector 20b get closer to the electronic unit 1. The retaining projection 26 projects from the bottom surface of the receiving groove 25, i.e., from the inner surface of the cylindrical portion 24 of the block body 16.

When assembling the electronic unit 1 with the above-described configuration, the electronic components 15 are in advance provided on a predetermined position of the printed circuit board 3, and the connector block 4 is assembled by embedding the terminal 17 in the base plate 18 of the block body 16 at an intermediate part of the terminal 17 by means of insert molding or press fitting. The block body 16 is mounted on the printed circuit board 3 with the other end of the terminal 17 fixed to the conductive pattern of the printed circuit board 3, and the connector blocks 4 are mounted on the printed circuit board 3.

Figure 5:
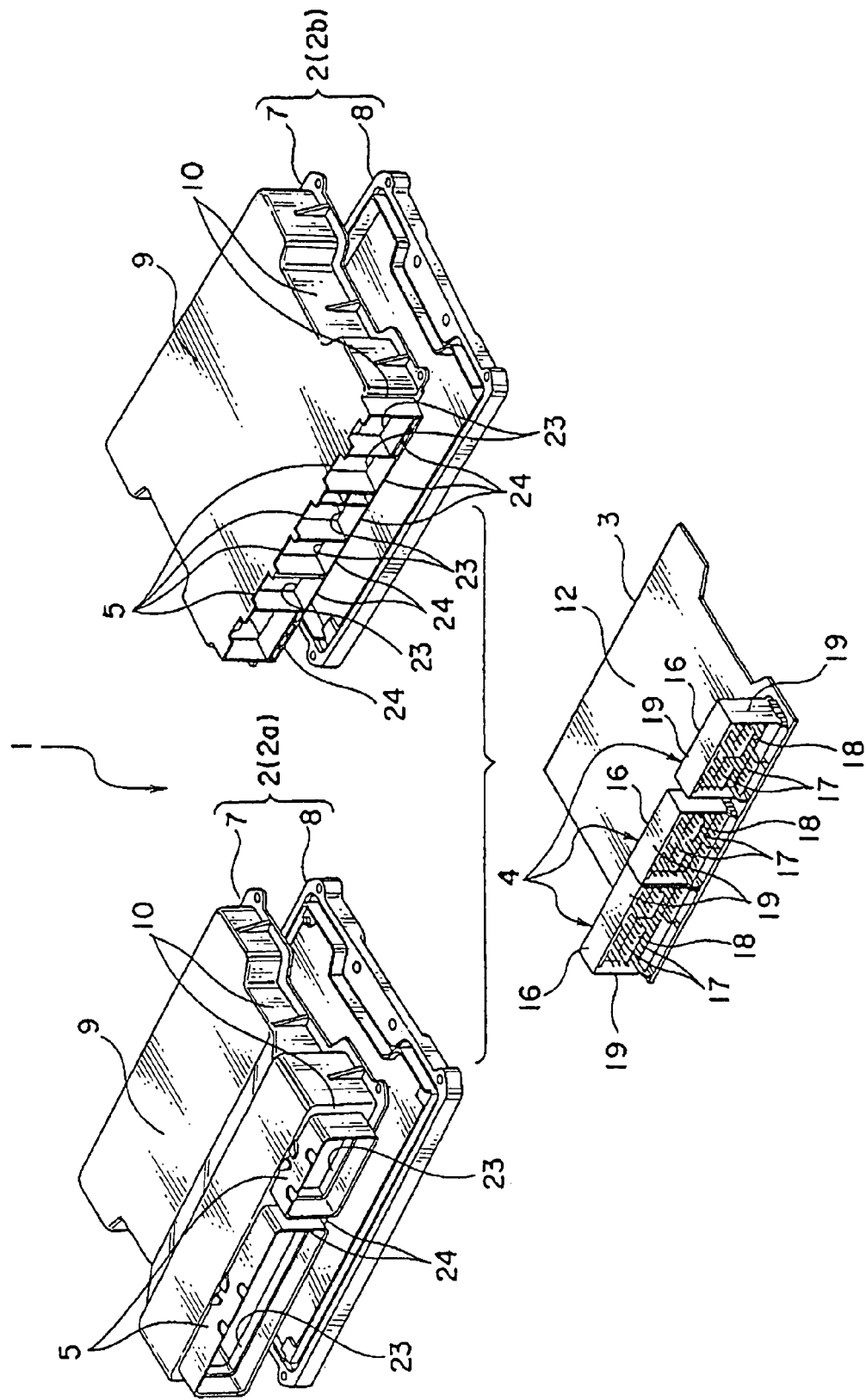
FIG. 5 is a perspective view illustrating a process of assembling the electronic units of FIGS. 1A and 1B.

Still referring to FIG. 5, the printed circuit board 3 and the connector blocks 4 are received in the inner space between the first case member 7 and the second case member 8 of the waterproof case 2a or the non-waterproof case 2b selected as the case. The electronic unit 1 with the aforementioned configuration is assembled in this manner.

Referring again to FIGS. 3A and 3B, when providing the electronic unit 1 having the waterproof case 2a with the mating waterproof connector 20a, the mating waterproof connector 20a is inserted into the connector introducing portion 5 and, as shown in FIG. 3A, the retaining projection 26 formed on the connector introducing portion 5 engages the locking arm 21 of the mating waterproof connector 20a.

Likewise, when connecting the mating non-waterproof connector 20b to the non-waterproof case 2b, the mating non-waterproof connector 20b is inserted into the connector introducing portion 5 and, as shown in FIG. 3B, the retaining projection 22 formed on the connector block 4 engages the locking arm 21 of the mating non-waterproof connector 20b. It should be noted here that the mating waterproof connector 20a is engaged with the waterproof case not via the retaining projection 22 of the connector block 4 for use in engaging the non-waterproof connector 20b, but via the retaining projection 26 of the connector introducing portion 5 formed integrally with the waterproof case 2a. Meanwhile, the same connector block can be used both in the waterproof case and in the non-waterproof case.

Thus, electrically connecting the electronic unit 1 to the mating connector 20a or 20b involves attaching the mating waterproof connector 20a or 20b to the connector block 4, electrically connecting the female terminals of the mating connector 20a or 20b to the terminals 17, and electrically connecting an electric wire connected to the female terminal to the electronic components 15 mounted on the printed circuit board 3 in accordance with the predetermined pattern.

According to the above-illustrated embodiment, the connector introducing portion 5 is formed separately from the connector block 4 upon the printed circuit board 3. This configuration allows the same printed circuit board 3 in combination with the same connector blocks 4 to be used not only in the electronic unit 1 having the waterproof case 2a but also in the electronic unit 1 which requires the non-waterproof case 2b. Therefore, commonality of components will be improved between the electronic unit 1 with the waterproof case 2a and the electronic unit 1 with the non-waterproof case 2b, thus reducing a production cost of the electronic unit 1.

By virtue of the retaining projection 26 of the waterproof case 2a for engaging the mating waterproof connector 20a, the electronic unit 1 is capable of securely engaging the mating waterproof connector 20a while a waterproof structure of a junction between the connector block 4 and the waterproof case 2a is sufficiently maintained.

Also, since the retaining projection 22 for engaging the mating non-waterproof connector 20b is provided on the connector block 4, the non-waterproof case 2b does not need to include the retaining projection. This configuration helps make the non-waterproof case 2b smaller.

It should be noted that the embodiment described above is illustrated as an example of the possible embodiments of the present invention and that numerous modifications and variations can be effectuated within the spirit and scope of the present invention

What is claimed is:

1. An electronic unit comprising:
   a box-shaped case having an opening exposing a connector block to an outside of the case, selected from the group consisting of a waterproof case and a non-waterproof case;
   a printed circuit board provided with electronic components and contained in said case;
   the connector block fixed only on said printed circuit board and connected to a mating connector through the opening in the box-shaped case; and
   a connector introducing portion formed integrally with said case and separately from said connector block for guiding said mating connector to said connector block,
   wherein the printed circuit board and the connector block are common to both the waterproof case and the non-waterproof case.

2. The electronic unit as set forth in claim 1, wherein
   said mating connector is a waterproof connector for said waterproof case or a non-waterproof connector for said non-waterproof case,
   said connector block includes an engagement portion which engages a locking portion of said mating non-waterproof connector, and
   said connector introducing portion includes an engagement portion which engages a locking portion of said mating waterproof connector.

3. A method for assembling an electronic unit comprising a series of steps in the following order:
   selecting a waterproof case having a first case member and a second case member and having an opening exposing a connector block to an outside of the case or a non-waterproof case having a first case member and a second case member and having an opening exposing a connector block to an outside of the case,
   providing a printed circuit board provided with electronic components,
   fixing the connector block only on said printed circuit board,
   inserting the printed circuit board with the mounted connector block between the first case member and the second case member of the selected case, and
   attaching the first case member to the second case member of the selected case;
   wherein the connector block is connected to a mating connector through the opening in said case, and a connector introducing portion is formed integrally with said case and separately from said connector block for guiding said mating connector to said connector block.

4. The method as set forth in claim 3, wherein
   said mating connector is a waterproof connector for said waterproof case or a non-waterproof connector for said non-waterproof case,
   said connector block includes an engagement portion which engages a locking portion of said mating non-waterproof connector, and
   said connector introducing portion of the waterproof case includes an engagement portion which engages a locking portion of said mating waterproof connector.

5. The electronic unit of claim 1, wherein the connector block is fixed to the printed circuit board.

6. The electronic unit of claim 1, wherein the connector block includes a block body and a plurality of terminals.

7. The electronic unit of claim 6, wherein the block body includes a base plate and a plurality of peripheral plates rising from an outer edge of the base plate.

8. The electronic unit of claim 7, wherein one of the peripheral plates is placed upon an outer edge of the printed circuit board and the connector block is fixed to the printed circuit board.

9. The electronic unit of claim 1, wherein a plurality of connector blocks are arranged lengthwise with respect to an outer edge of the printed circuit board.

10. The electronic unit of claim 1, wherein the non-waterproof case is smaller than the waterproof case.

11. The electronic unit of claim 1, wherein the case member is made of a first case member and a second case member, the second case member engages the first case member in such a manner that the second case member seals openings formed on an outer periphery of the first case member continuous with peripheral walls extending around the first case member.

12. An electronic unit consisting of:
   a box-shaped case having an opening exposing a connector block to an outside of the case, selected from the group consisting of a waterproof case and a non-waterproof case;
   a printed circuit board provided with electronic components and contained in said case;
   the connector block fixed only on said printed circuit board and connected to a mating connector through the opening in the box-shaped case, the connector block including a block body and a plurality of terminals and the block body including a base plate and a plurality of peripheral plates rising from an outer edge of the base plate; and
   a connector introducing portion formed integrally with said case and separately from said connector block for guiding said mating connector to said connector block,
   wherein the printed circuit board and the connector block are common to both the waterproof case and the non-waterproof case.

* * * * *